United States Patent [19]
Galvin-Donoghue et al.

[11] Patent Number: 5,621,069
[45] Date of Patent: Apr. 15, 1997

[54] METHOD FOR PREPARATION OF CONJUGATED ARYLENE AND HETROARYLENE VINYLENE POLYMERS

[75] Inventors: Mary Galvin-Donoghue, Titusville; Sehwan Son, Murray Hill, both of N.J.

[73] Assignee: Lucent Technologies Inc., Murray Hill, N.J.

[21] Appl. No.: 528,820

[22] Filed: Sep. 15, 1995

Related U.S. Application Data

[62] Division of Ser. No. 321,287, Oct. 11, 1994, abandoned.

[51] Int. Cl.$^6$ .......................... C08G 61/02; C08G 75/00
[52] U.S. Cl. .......................... 528/379; 313/503; 528/380; 528/397; 528/481
[58] Field of Search .......................... 528/377, 379, 528/380, 396, 397, 481, 503

[56] References Cited

U.S. PATENT DOCUMENTS 4,521,589  6/1985  Yamamoto .......................... 528/379

Primary Examiner—Christopher Henderson

[57] ABSTRACT

A technique is described for the preparation of conjugated arylene and heteroarylene vinylene polymers by thermal conversion of a polymer precursor prepared by reacting an aromatic ring structure with an aqueous solution of an alkyl xanthic acid potassium salt. In this processing sequence the xanthate group acts as a leaving group and permits the formation of a prepolymer which is soluble in common organic solvents. Conversion of the prepolymer is effected at a temperature ranging from 150°–250° C. in the presence of forming gas. Studies have shown that electroluminescent devices prepared in accordance with the described technique evidence internal quantum efficiencies superior to those of the prior art due to the presence of pinhole free films and therefore permit the fabrication of larger area LED's than those prepared by conventional techniques.

5 Claims, 1 Drawing Sheet

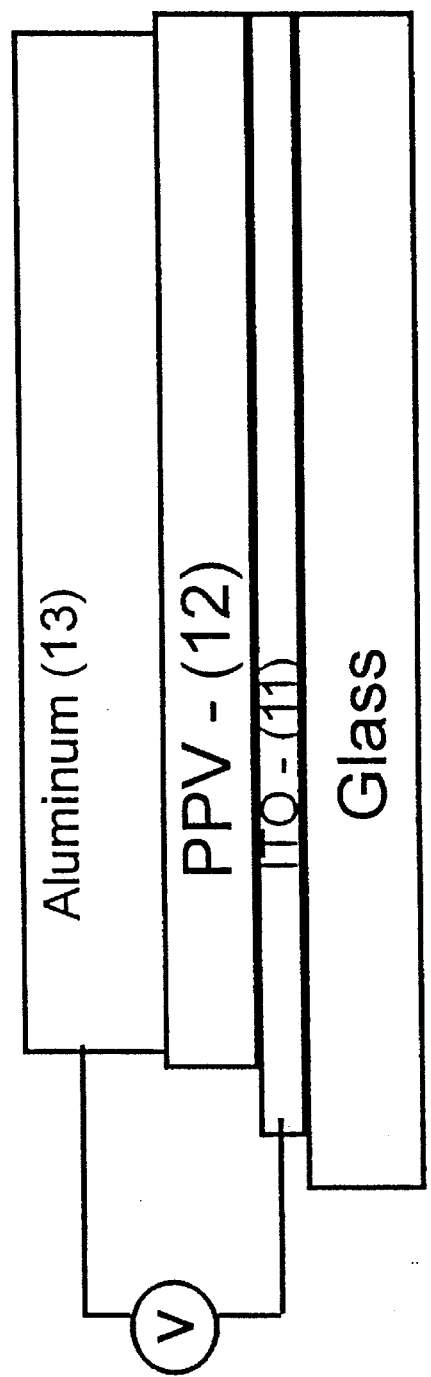
Figure 1 – Electroluminescent Device

METHOD FOR PREPARATION OF CONJUGATED ARYLENE AND HETROARYLENE VINYLENE POLYMERS

This application is a division of our patent application Ser. No. 08/321,287, filed on Oct. 11, 1994, now abandoned.

FIELD OF THE INVENTION

This invention relates to a method for the preparation of phenylene vinylene polymers by thermal conversion of a novel precursor polymer and to devices including same.

BACKGROUND OF THE INVENTION

Recently, significant advances have been made in the development of solid-state light emitting devices. Among the most recent discoveries was the discovery that conjugated polymers are particularly well suited for this purpose in that they provide excellent charge transport characteristics and useful quantum efficiencies for luminescence. The most popular of the materials suitable for this use is poly (p-phenylene vinylene) (PPV) and its derivatives which are capable of being prepared in the form of a high quality film which evidences strong photoluminescence in a band centered near 2.5 eV.

Heretofore, synthesis of poly (p-phenylene vinylene) and some of its analogs has been commonly effected by preparing a precursor polymer and thermally converting the precursor in a vacuum or inert atmosphere to the desired poly (p-phenylene vinylene). A typical procedure for attaining this end, commonly called the Wessling route, involves polymerization of a bis sulfonium salt intermediate, prepared from dichloro p-xylene and tetrahydrothiophene, in a water-methanol mixture in the presence of a base and subsequently dialyzing against distilled water to remove inorganic salts and unreacted monomer. The precursor polymer is then recovered, dissolved in methanol and spin coated upon a suitable substrate. At this juncture, the precursor is thermally converted at a temperature ranging from 150°–300° C. in a vacuum or in an inert atmosphere comprising argon or nitrogen to yield the desired poly (p-phenylene vinylene).

In this process, the polymerization is divided into two steps, the first involving the formation of an anion by an acid-base equilibrium. In the second step, the anion undergoes a elimination reaction of tetrahydrothiophene to yield a quinone structure which polymerizes to a water soluble precursor polymer. In effecting this reaction, a group polarizer is employed to stabilize the anion and in the 1,6-elimination a leaving group is employed to form the quinoid. P-xylene derivatives possessing such polarizer and leaving group may be polymerized and the elimination of the polarizer results in the formation of poly(p-phenylene vinylene), PPV.

In this technique, the precursor polymer so formed is a polyelectrolyte which is soluble in only water and methanol, both of which are poor spinning solvents. Accordingly, the use of this technique has not proven satisfactory for the generation of films having high quality due to the formation of a large number of pinholes which typically lead to shorting of light emitting diode devices. Additionally, hydroxyl units in the precursor result in the formation of carbonyl groups in the final product which tend to lower photoluminescence and electroluminescence. Although efforts to reduce carbonyl formation in this processing sequence have been successful by conducting the conversion step in a hydrogen/nitrogen atmosphere, it is still advantageous to avoid the presence of hydroxyl groups and to be able to employ a precursor which is soluble in organic solvents.

Subsequent efforts to overcome the limitations of the Wessling technique involved the polymerization of α-chloro-α'-alkyl(aryl)sulfinyl- and α-chloro-α'-alkyl(aryl)sulfonyl-p-xylenes in a modified Wessling bissulfonium salt technique. Using a sulfinyl group polarizer, the resultant polymer is found to be soluble in organic solvents such as tricholorethylene, tetrahydrofuran and dimethylformaldehyde and is stable and may be converted to trans-PPV. Additionally, the use of a polarizer having a sulfonyl group results in a polymer of high thermal stability. And lastly, weight loss during conversion approaches 54% and tends to cause a diminution in film quality.

The use of sulfinyl or sulfonyl as a leaving group of the precursor polymer has inherent limitations. Thus, for example, the use of a sulfinyl group yields a precursor polymer having a molecular weight of only a few thousand daltons which is not high enough to obtain stable films. The use of the sulfonyl group permits the attainment of molecular weights ranging up to 30,000 daltons. However, such values are still significantly below the level of the precursor polymers prepared by the Wessling technique. Other limitations include the need for a conversion temperature close to 280° C. and the two step synthesis of the monomer includes assymetrical coupling which can reduce the yield of the reaction below 50%.

Accordingly, workers in the art have continued to focus their interest upon the preparation of phenylene/vinylene films by novel procedures which obviate the foregoing limitations.

SUMMARY OF THE INVENTION

In accordance with the present invention, these prior art limitations have been effectively obviated by a novel processing sequence wherein a xanthate leaving group is employed, so permitting the preparation of a precursor polymer which is soluble in common organic solvents. Studies have revealed that the xanthic acid which evidences a low pKa value acts as a leaving agent during the polymerization. Additionally, the xanthate group in the precursor polymer which has a similar structure to the leaving groups of the Chugaev reaction, also acts as a leaving group during thermal conversion. Precursors prepared in accordance with the described technique are fully soluble in common organic solvents such as dicloromethane, chloroform, tetrahydrofuran, 1,4-dioxane and cyclohexanone, and evidence molecular weights of the order of several hundred thousand daltons. Conversion temperatures employed in the polymerization process may range from 200°–250° C., which are lower than those required for the Wessling technique, which permits the attainment of quantum efficiencies equivalent to those of the prior art technology.

BRIEF DESCRIPTION OF THE DRAWING

The invention will be more readily understood by reference to the following detailed description taken in conjunction with the accompanying drawing wherein:

FIG. 1 is a front elevational view in cross-section of of an electroluminescent device prepared in accordance with the present invention.

DETAILED DESCRIPTION OF THE INVENTION

The first step in the practice of the present invention involves synthesizing a monomer suitable for use herein. This process involves reacting an aromatic ring structure of the general formula

X-R-X wherein X is selected from the group consisting of chloromethyl and bromomethyl atoms and R is an arylene group selected from among thiophene, naphthalene, anthracene and benzene in an organic solvent with an aqueous solution of an alkyl xanthic acid potassium salt of the general formula

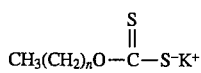

wherein n is an integer ranging from 0 to 3 in the presence of a phase transfer catalyst, tetraethyl ammonium hydrogen sulfate being found to be particularly useful for this purpose. After stirring the components of the reaction mixture, a precipitate is obtained. The precipitate from this reaction is an arylene group bearing two xanthate groups in the para position. Suitable washing of the resultant product and drying thereof is effected to obtain the desired monomer.

The monomer is then dissolved in a suitable organic solvent and reacted with potassium tertiary butoxide from which the desired precursor polymer is obtained by precipitation. During this process the xanthic acid which evidences a low pKa value acts as a leaving group.

The polymer so obtained is completely soluble in common organic solvents such as dicloromethane, chloroform, tetrahydrofuran, 1,4-dioxane and cyclohexanone and evidences a molecular weight of several hundred thousand daltons, typically 200,000 to 400,000 as determined by gel permeation chromotography using polystyrene standards. The prepolymer is also found to be highly stable at room temperature in solid form.

Thin films of the precursor polymer ranging in thickness from 500–3000 Angstroms, typically 1,000 Angstroms after conversion, may then be prepared by spinning a solution of the precursor on fused silica glass bearing indium tin oxide or silicon wafers.

conversion of the precursor to poly(p-phenylene vinylene) is then effected at temperatures ranging from 150° to 250° C. under controlled atmospheres.

After conversion of the precursor film to poly(p-phenylene vinylene), it is important to exercise care in handling. The polymer should be kept in an inert atmosphere following the elimination step, particularly in transferring samples in and out of the apparatus and during measurements. Ultraviolet and visible light with the exception of red light should also be excluded after the conversion and characterization stages of the procedure.

The thermal conversion of the precursor is effected in an inert atmosphere, typically 15% hydrogen in 85% argon (forming gas). This conversion of the precursor polymer is typically effected in a glass vessel equipped with a thermocouple. The vessel is placed in an oven, the temperature of which is controlled by a programmable temperature controller linked to the thermocouple. The glass vessel is maintained under a constant flow of the inert gas during the heat-up, conversion and cooling cycles which were as follows:

(a) 1 hour at 20° C. to remove residual solvent, (b) 4 hours to ramp up to the conversion temperature, (c) 6 hours at the conversion temperature, and (d) cooling to ambient temperature within 2 hours.

Examples of the practice of the present invention are set forth below. It will be understood that these examples are set forth solely for purposes of exposition and are not to be construed as limiting.

EXAMPLE 1

94.7 mmol (25 g) of α, α'-dibromo-p-xylene dissolved in 400 milliliters of dichloromethane were added to an aqueous solution of the potassium salt of ethylxanthic acid (38 grams in 200 milliliters of water (237 mmol). The mixture was stirred vigorously and 150 milligrams of tetrabutylammonium hydrogen sulfate added thereto. After stirring for an additional 4 hours, a precipitate was formed and collected by vacuum filtration and washed with water. The remaining heterogeneous reaction mixture was then transferred into a separatory funnel and washed with 200 milliliters of water. An organic layer was collected and dried with anhydrous potassium carbonate. The drying agent was then removed by vacuum filtration. Hexane was then added to the resultant product, so causing additional precipitation. This precipitate was collected by vacuum filtration and combined with the solid product collected previously. Following, the combined products were redissolved in 400 milliliters of dichloromethane and subjected to filtration to remove insoluble impurities. The filtered solution was then added to the dichloromethane solution causing monomer precipitation and yielding 25.6 grams of a colorless solid monomer after filtration.

Then, 3 grams of the monomer so obtained dissolved in 170 milliliters of dry tetrahydrofuran were added to 8.5 milliliters of a 1N solution of potassium-t-butoxide dissolved in tetrahydrofuran in an ice-salt bath under a nitrogen atmosphere at a temperature ranging from −5 to 0 degrees Centigrade. After 30 minutes of stirring, the resultant solution was poured into 300 milliliters of ethanol from which there resulted a gummy precipitate which was collected, dried under high vacuum and redissolved in 60 milliliters of dichloromethane. The solution was then added dropwise into 300 milliliters of ethanol which was stirred vigorously. The resultant precipitate was then collected by vacuum filtration and dried, so yielding 960 milligrams of a poly(p-phenylene vinylene) precursor polymer as a pale yellow solid.

An indium tin oxide (ITO) coated glass substrate was chosen as the substrate for fabrication of light emitting diodes and cleaned by sequential ultrasonication in deionized water, methanol, acetone and trichloroethane, and then dried and baked at 110° C. in an inert atmosphere. Following, a thin film having a thickness of 2,000 Angstroms of poly (p-phenylene vinylene) (PPV) precursor was spun onto the substrate by conventional spinning techniques and converted at 225° C. in the presence of forming gas to yield a film of approximately 1,000 Angstroms thickness. At this juncture a thin film of aluminum was deposited through a shadow mask upon the film to form a device. Devices prepared were in the form of circular dots defined by means of a metal mask.

Light was emitted from the described structures when the ITO was biased positively and the aluminum biased negative. Measurement of the light emitted from these light emitting diodes (LEDs) was effected with a silicon photodiode, and internal quantum efficiencies were calculated by taking into account losses in glass substrates, the solid angle of the photodiode collection, ITO transmission losses, and the responsiveness of the photodiode.

The ITO/PPV/Al devices were initially operated at 12 volts. At 12 volts, the current density flowing through the device was about 500 μA mm$^{-2}$ and the external quantum efficiency was 0.01% plus or minus 0.001%. This corresponds to an internal quantum efficiency of about 0.05%. The best electroluminescent devices described in the prior art evidenced similar internal quantum efficiencies.

The procedure employed in depositing the PPV layer was as follows: 63 milligrams of the precursor polymer so obtained were then dissolved in 3 milliliters of cyclohexanone. The solution was then applied to an indium tin oxide film deposited on a glass substrate at 2000 rpm. The film so deposited was then converted into poly(p-phenylene vinylene) (PPV) by heating the assembly at 225° C. for 6 hours under forming gas to yield a 1,000 Angstroms thick film which was found to be free of pinholes. The quality of the film was tested by depositing aluminum by vacuum evaporation upon the PPV film, covering 1.7 cm$^2$ to yield a ITO/PPV/Al sandwich device. The entire area of this device was illuminated when a voltage of 12 volts was applied, so indicating the lack of shorts caused by pinholes. This end has not been achieved heretofore by the prior art technology.

FIG. 1 is a front elevational view in cross-section of a typical electroluminescent device including the novel heteroarylene vinylene polymers converted in the presence of forming gas by thermal means. Shown in the Figure is a substrate member 11 having deposited thereon a thin film of a conjugated heteroarylene vinylene polymer 12 prepared in the manner described. Also shown is conducting layer 13.

EXAMPLE 2

This example describes the preparation of a poly (p-thienylene vinylene (PTV) film capable of being prepared in the form of a high quality film.

A mixture comprising 11 grams of 2,5-thienylene bis (methylene tetrahydrothiophenium chloride) and 13 grams of the potassium salt of ethylxanthic acid were dissolved in 184 milliliters of water. Following, 184 milliliters of dimethyl ether were added to the mixture. After stirring for 3 hours, the reaction mixture was transferred into a separatory funnel and 200 milliliters of water added to the solution. Then the solution was shaken vigorously and an organic layer collected, the solvent being removed by rotary evaporation. The resultant crude product was then purified by flash chromotography using a mixture of hexane and dichloromethanol (10:1) as an eluent to yield 7.1 grams of a monomer.

1.7 grams of that monomer were then dissolved in 20 milliliters of tetrahydrofuran at 0° C. using an ice bath under a nitrogen atmosphere and 5.3 milliliters of a solution comprising potassium tertiary butoxide in 1N tetrahydrofuran added thereto. An additional 10 milliliters of tetrahydrofuran were then added to the solution and the reaction vessel removed from the ice bath. After stirring for 30 minutes, the reaction mixture was poured into a flask containing 200 milliliters of cold ethanol (0° C.) with stirring. Five milliliters of 1N hydrochloric acid was then added to this solution to yield a brownish product which was collected and dried to yield 430 milligrams of precursor polymer.

84 grams of the resultant PTV precursor polymer were then dissolved in 1 milliliter of cyclohexanone. The solution was then applied to a doubly polished silicon wafer and spin coated at 2,000 rpm. Conversion of the film so deposited was then effected at 250° C. for 6 hours under forming gas to yield a PTV film of 1,100 Angstroms. IR analysis proved that the xanthate group had been eliminated.

Based upon the foregoing data, it is evident that the electroluminescent devices prepared with the poly(p-phenylene vinylene) and converted thermally in the described manner in the presence of forming gas evidence comparable internal quantum efficiencies to the prior art devices and due to improved film quality allowed for the fabrication of larger area LED's.

While the invention has been described in detail in the foregoing description and in the illustrative embodiment, it will be appreciated by those skilled in the art that many variations may be made without departing from the spirit and scope of the invention.

What is claimed is:

1. Method for the preparation of conjugated arylene and hetreroarylene vinylene polymers which comprises the steps of (a) preparing a precursor polymer by reacting an aromatic ring structure of the general formula

X-R-X wherein X is selected from the group consisting of chloromethyl and bromomethyl groups and R is an aromatic group selected from the group consisting of thiophene, naphthalene, anthracene and benzene with an aqueous solution of an alkyl xanthic acid potassium salt of the general formula

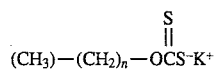

wherein n is an integer ranging from 0–3 in the presence of a phase transfer catalyst to obtain a monomer, and reacting the monomer so obtained with potassium tertiary butoxide to obtain a precursor polymer of the general formula

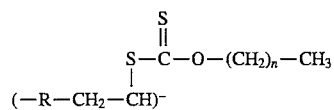

wherein n is an integer ranging from 0–3, and R is an aromatic ring selected from the group consisting of benzene, thiophene, naphthalene and anthracene, and (b) subjecting said precursor polymer to thermal conversion at a temperature ranging from 150° to 250° C. in the presence of a gas.

2. Method in accordance with claim 1 wherein the precursor polymer is obtained by reacting an aromatic ring structure of the general formula

X-R-X wherein X is selected from the group consisting of chloromethyl and bromomethyl groups and R is an aromatic group selected from the group consisting of thiophene, naphthalene, anthracene and benzene with an aqueous solution of an alkyl xanthic acid potassium salt of the general formula

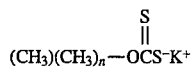

wherein n is an integer ranging from 0–3 in the presence of a phase transfer catalyst to obtain a monomer, and reacting the monomer so obtained with potassium tertiary butoxide to obtain the precursor polymer.

3. Method in accordance with claim 1 wherein the phase transfer catalyst is tetraethyl ammonium hydrogen sulfate.

4. Method in accordance with claim 1 wherein the weight average molecular weight of the prepolymer is within the range of 100,000 to 600,000 daltons for PPV.

5. Method in accordance with claim 1 wherein the conjugated polymer is poly (p-thienylene vinylene).

* * * * *